United States Patent
Yamazawa

(10) Patent No.: US 7,432,467 B2
(45) Date of Patent: Oct. 7, 2008

(54) PLASMA PROCESSING APPARATUS

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/691,803

(22) Filed: Mar. 27, 2007

(65) Prior Publication Data

US 2007/0235420 A1 Oct. 11, 2007

Related U.S. Application Data

(60) Provisional application No. 60/791,466, filed on Apr. 13, 2006.

(30) Foreign Application Priority Data

Mar. 28, 2006 (JP) .............................. 2006-088156

(51) Int. Cl.
*B23K 10/00* (2006.01)
(52) U.S. Cl. ............................ 219/121.36; 219/121.54; 219/121.43; 156/345.47
(58) Field of Classification Search .............. 219/121.4, 219/121.41, 121.43, 121.44, 121.54, 121.57; 156/345.34, 345.44, 345.47, 345.41
See application file for complete search history.

(56) References Cited

U.S. PATENT DOCUMENTS 5,464,499 A * 11/1995 Moslehi et al. ............. 438/729
5,494,522 A   2/1996 Moriya et al.
2004/0194890 A1* 10/2004 Moroz .................. 156/345.48

FOREIGN PATENT DOCUMENTS

JP          6-283474      10/1994

* cited by examiner

*Primary Examiner*—Mark H Paschall
(74) *Attorney, Agent, or Firm*—Oblon, Spivak, McClelland, Maier & Neustadt, P.C.

(57) ABSTRACT

A plasma processing apparatus performs a desired plasma processing on a target substrate by using a plasma generated from a processing gas by forming a high frequency electric field in an evacuable processing chamber having an electrode. The plasma processing apparatus includes a high frequency power supply for outputting a high frequency power; and a central power feeder connected with a central portion of a rear surface of the electrode to supply the high frequency power from the high frequency power supply to the electrode. The plasma processing apparatus further includes a peripheral power feeder connected with a peripheral portion of the rear surface of the electrode in parallel with the central power feeder to supply the high frequency power from the high frequency power supply to the electrode.

14 Claims, 5 Drawing Sheets

PLASMA PROCESSING APPARATUS

FIELD OF THE INVENTION

The present invention relates to an apparatus for performing a plasma processing on a target substrate; and, more particularly, to a high frequency discharge plasma processing apparatus for generating a plasma by applying a high frequency power to an electrode.

BACKGROUND OF THE INVENTION

In a manufacturing process of a semiconductor device or an FPD (Flat Panel Display), a plasma is used for performing a microprocessing or a treatment such as etching, deposition, oxidation, sputtering or the like so that a reaction of a processing gas can be carried out under a relatively low temperature. In general, a plasma generation technique of a plasma processing apparatus is classified into two types: one using glow discharge or high frequency power and the other using microwaves.

As disclosed in Japanese Patent Laid-open Application No. H6-283474 and U.S. Pat. No. 5,494,522, for example, the high frequency discharge plasma processing apparatus applies a high frequency power for plasma generation to an upper electrode or a lower electrode via a matching unit, the upper and the lower electrode being disposed in parallel in an evacuable processing chamber or a reaction chamber, the lower electrode having thereon a target substrate (semiconductor wafer, glass substrate or the like). Next, electrons are accelerated by a high frequency electric field generated by the high frequency power, and ionization by collision between the electrons and the processing gas generates a plasma. Then, radicals or ions in the plasma are consumed in performing a desired microprocessing (e.g., an etching processing) on a surface of the substrate.

Recently, along with the trend for a miniaturization of a design rule in a manufacturing process, a high density plasma in a low pressure is required for a plasma processing. The aforementioned high frequency discharge plasma processing apparatus employs a high frequency power of a frequency band (higher than or equal to 40 MHz) much higher than a conventional frequency band (13.56 MHz). However, if a frequency of a high frequency discharge increases, the high frequency power applied from a high frequency power supply to a rear surface or a backside of an electrode via a power feeder flows toward a main surface of the electrode (surface facing a plasma) along the surface of the electrode by skin effects. Next, a high frequency current flows from each portion on the main surface of the electrode toward the plasma. In a conventional plasma processing apparatus, a single power feeder is connected with a central portion of the rear surface of the electrode, so that a singularity is provided at a central portion of the main surface of the electrode which is farthest away from the power feeder. Therefore, a discharge current in the central portion of the main surface of the electrode (high frequency current flowing toward the plasma) becomes greater than that in an edge portion thereof and, hence, a plasma density becomes higher in the central portion than in the edge portion. As a result, process characteristics become radially non-uniform.

SUMMARY OF THE INVENTION

It is, therefore, an object of the present invention to provide a plasma processing apparatus capable of accomplishing a uniform plasma density distribution or improving in-surface uniformity of process characteristics by uniforming or controlling a discharge current distribution on an electrode to which a high frequency power is applied.

In accordance with the present invention, there is provided a plasma processing apparatus for performing a desired plasma processing on a target substrate by using a plasma generated from a processing gas by forming a high frequency electric field in an evacuable processing chamber having an electrode, the plasma processing apparatus including: a high frequency power supply for outputting a high frequency power; a central power feeder connected with a central portion of a rear surface of the electrode to supply the high frequency power from the high frequency power supply to the electrode; and a peripheral power feeder connected with a peripheral portion of the rear surface of the electrode in parallel with the central power feeder to supply the high frequency power from the high frequency power supply to the electrode.

In the above-described configuration, the high frequency power from the high frequency power supply is distributed into the central power feeder and the peripheral power feeder. When the high frequency current flowing in the central power feeder reaches the central portion of the rear surface of the electrode, it flows toward a main surface of the electrode via an edge thereof. At this time, a discharge current distribution becomes maximum at a singularity provided at an opposite side of the central power feeder, i.e., at a central portion of the electrode.

On the other hand, when the high frequency current flowing in the peripheral power feeder reaches the peripheral portion of the rear surface of the electrode, it flows toward the main surface of the electrode via the edge thereof. At this time, a discharge current distribution becomes maximum at a singularity provided at an opposite side of the peripheral power feeder (point symmetry). The current distribution obtained by the high frequency power supplied from the central power feeder and that obtained by the high frequency power supplied from the peripheral power feeder are superposed in each portion on the main surface of the electrode, thereby obtaining spatial distribution characteristics of the resultant discharge current. By controlling a ratio (distribution ratio) between the high frequency current flowing in the central power feeder and that flowing in the peripheral power feeder, it is possible to uniform or control the spatial distribution characteristics of the resultant discharge current.

In accordance with an embodiment of the present invention, the peripheral power feeder has a plurality of peripheral power feeders connected with the peripheral portion of the rear surface of the electrode, the peripheral power feeders being spaced apart from each other at regular intervals in a circumferential direction. In this case, it is preferable that the peripheral power feeders have same waveguide characteristics and same material, shape and size for symmetrical distribution of power and current in the electrode. Further, positions of connection points of the peripheral power feeders to the electrode (in particular, positions of a radial direction) can be determined depending on a size or a diameter of a target substrate.

In the embodiment of the present invention, the peripheral power feeders are provided between the electrode and a conductive power distribution plate facing the electrode thereunder, the conductive power distribution plate being electrically connected with the high frequency power supply. In this case, the central power feeder can be provided between the electrode and the power distribution plate in parallel with the peripheral power feeders.

In accordance with another embodiment of the present invention, a variable capacitor is connected in series with at least one of the central power feeder and the peripheral power feeder to apply a variable impedance. By varying a capacitance of the variable capacitor, a ratio (distribution ratio) between a central branch current flowing in the central power feeder and a peripheral branch current flowing in the peripheral power feeder can be varied and, accordingly, it is possible to freely control the spatial distribution characteristics of the resultant discharge current on the main surface of the electrode.

When the variable capacitor is provided, it is preferable to further provide a first current measuring unit for measuring a current value of the central branch current flowing in the central power feeder; a second current measuring unit for measuring a current value of the peripheral branch current flowing in the peripheral power feeder; and a capacitance controller for controlling a capacitance of the variable capacitor based on the current values of the central and the peripheral branch current measured by the first and the second current measuring unit, respectively. The capacitance controller feedbacks the current values of the central and the peripheral branch current detected by the first and the second current detector, and controls the capacitance of the variable capacitor to set a ratio (distribution ratio) between the central and the peripheral branch current to a preset value.

In accordance with still another embodiment of the present invention, there is provided a phase shifter for shifting a phase of the high frequency power passing through either the central power feeder or the peripheral power feeder. The phase shifter shifts a phase of the high frequency power flowing through, e.g., the peripheral power feeder, so that a phase difference is generated between the central branch current flowing in the central power feeder and the peripheral branch current flowing in the peripheral power feeder. By controlling a superposition state of the high frequency current in each portion on the main surface of the electrode (the amount of resultant vector) depending on the phase difference, it is possible to control the spatial distribution characteristics of the resultant discharge current.

In accordance with the plasma processing apparatus of the present invention, the aforementioned configuration and operation makes it possible to uniformly or control the discharge current distribution on the electrode to which the high frequency power is applied. Accordingly, it is possible to accomplish uniform plasma density distribution or improve in-surface uniformity of the process characteristics.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Hereinafter, embodiments of the present invention will be described in detail with reference to the accompanying drawings.

Embodiment 1

Figure 1:
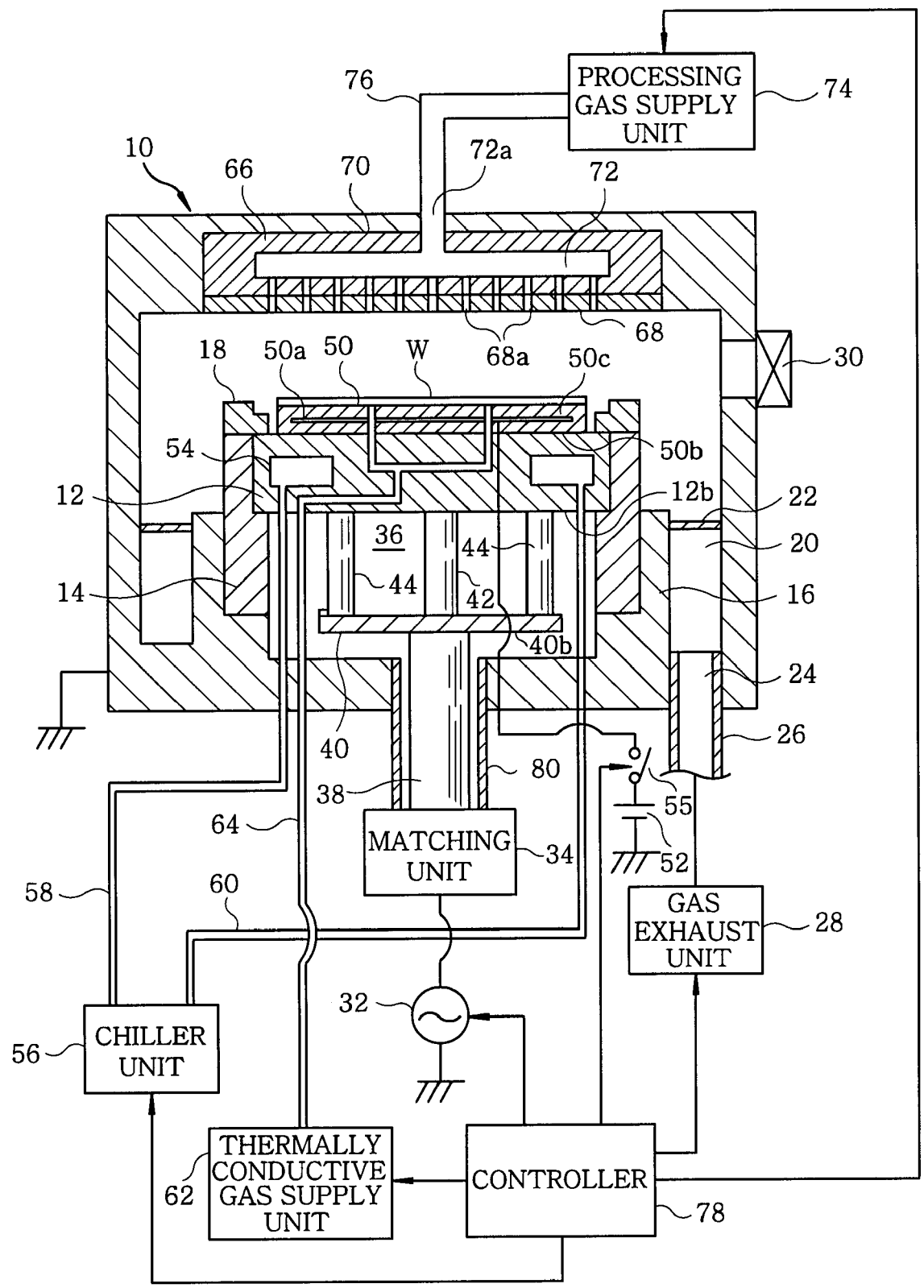
FIG. 1 shows a vertical cross sectional view of a configuration of a plasma etching apparatus in accordance with a first embodiment of the present invention.

FIG. 1 shows a configuration of a plasma processing apparatus in accordance with a first embodiment of the present invention. The plasma processing apparatus is configured as a cathode-coupled parallel plate type plasma etching apparatus and has a cylindrical chamber (processing chamber) 10 made of metal such as aluminum or a stainless steel. The chamber 10 is frame grounded.

Horizontally disposed inside the chamber 10 is a circular plate shaped susceptor 12 serving as a lower electrode for mounting thereon a target substrate, e.g., a semiconductor wafer W. The susceptor 12 is supported by a cylindrical conductive supporting portion 16 elongated upward from a bottom portion of the chamber 10 via a cylindrical insulating maintaining portion 14 made of, e.g., aluminum. An annular focus ring 18 made of, e.g., quartz, is provided on a top surface of the cylindrical maintaining portion 14 to surround a top surface of the susceptor 12.

An annular exhaust passageway 20 is formed between a sidewall of the chamber 10 and the cylindrical supporting portion 16. An annular baffle plate 22 is disposed at an entrance of the exhaust passageway 20 or in the middle thereof and, also, a gas exhaust port 24 is installed at a bottom portion of the exhaust passageway 20. The gas exhaust port 24 is connected with a gas exhaust unit 28 via a gas exhaust line 26. The gas exhaust port 28 has a vacuum pump such as a turbo molecular pump or the like and is able to depressurize a processing space in the chamber 10 to a desired vacuum level. Attached to the sidewall of the chamber 10 is a gate valve 30 for opening/closing a loading/unloading port of the semiconductor wafer W.

A high frequency power supply 32 for generating a plasma and a DC bias is electrically connected with the susceptor 12 via a matching unit 34 and a high frequency power feed path 36. The high frequency power supply 32 outputs a high frequency power of, e.g., 60 MHz, at a specific power level. The matching unit 34 matches an impedance of the high frequency power supply 32 to that of a load (electrode, plasma and chamber). The high frequency power supply line 36 is a main feature of this embodiment of the present invention and includes a main power feeder 38, a power distribution plate 40, a central power feeder 42 and peripheral power feeders 44. A configuration and an operation of the power feed path 36 will be described in detail later.

Installed on the top surface of the susceptor 12 is an electrostatic chuck 50 for holding the semiconductor wafer W with an electrostatic adsorptive force. The electrostatic chuck 50 is formed by inserting an electrode 50a made of a conductive film between a pair of insulating films 50b and 50c. A DC power supply 52 is electrically connected with the electrode 50a via a switch 55. The semiconductor wafer W can be adsorptively held on the electrostatic chuck 50 by a Coulomb force generated by a DC voltage applied from the DC power supply 52.

The susceptor 12 has therein an annular coolant chamber 54 extending along a circumferential direction, for example. A coolant of a specific temperature, e.g., a cooling ice, supplied from a chiller unit 56 via lines 58 and 60 is circulated in the coolant chamber 54. Thus, a processing temperature of the semiconductor wafer W on the electrostatic chuck 50 can be controlled by a temperature of the coolant. Further, a thermally conductive gas from a thermally conductive gas supply unit 62, e.g., He gas, is supplied between a top surface of the electrostatic chuck 50 and a backside of the semiconductor wafer W via a gas supply line 64.

Installed on a ceiling portion of the chamber 10 is a shower head 66 serving as a lower electrode of a ground potential, the shower head 66 facing the susceptor 12 in parallel. The shower head 66 includes an electrode plate 68 having on a bottom surface thereof a plurality of gas ventholes 68a and an electrode support 70 for detachably supporting the electrode plate 68. The electrode support 70 has therein a gas chamber 72 and, also, a gas inlet opening 72a of the gas chamber 70 is connected with a processing gas supply unit 74 via a gas supply line 76. Further, the electrode plate 68 is made of, e.g., Si or SiC, and the electrode support 70 is made of, e.g., alumite treated aluminum.

A controller 78 controls an overall operation (sequence) of the plasma etching apparatus and an individual operation of an each component in the plasma etching apparatus, e.g., the gas exhaust unit 28, the high frequency power supply 32, the switch 55 of the DC power supply, the chiller unit 56, the thermally conductive gas supply unit 62, the processing gas supply unit 74 and the like.

When an etching process is performed in the plasma etching apparatus, the gate valve 30 is first opened, and a semiconductor wafer W to be etched is loaded into the chamber 10 and mounted on the electrostatic chuck 50. Next, an etching gas (in general, a gas mixture) is introduced from the processing gas supply unit 74 into the chamber 10 at a specific flow rate and a flow rate ratio. Then, a pressure inside the chamber 10 is set to a set value by the gas exhaust unit 28. Further, the high frequency power supply 32 is turned on and outputs a high frequency power at a specific power level. The high frequency power is applied to the susceptor 12 via the matching unit 34 and the high frequency power feed path 36. Moreover, a DC voltage is applied from the DC power supply 52 to the electrode 50a of the electrostatic chuck 50 by turning on the switch 55. Accordingly, the semiconductor wafer W is fixed on the electrostatic chuck 50 by the electrostatic adsorptive force thereof. The etching gas discharged from the shower head 66 is converted into a plasma by a high frequency discharge generated between the electrodes 12 and 66. Then, radicals or ions generated in the plasma are used to etch a main surface of the semiconductor wafer W.

Hereinafter, a configuration and an operation of the high frequency power feed path 36 that is a central feature of the present invention in this plasma processing apparatus will be described with reference to FIGS. 1 to 3.

As described above, the high frequency power feed path 36 between the matching unit 34 and the susceptor (lower electrode) 12 includes the main power feeder 38, the power distribution plate 40, the central power feeder 42 and the peripheral power feeders 44. To be specific, the circular plate shaped power distribution plate 40 is horizontally disposed under the susceptor 12 (lower electrode) in parallel therewith. Further, the single main power feeder 38 is vertically provided between the matching unit 34 and the power distribution plate 40. Furthermore, a single central power feeder 42 and a plurality of, e.g., four peripheral power feeders 44 are provided in parallel with each other between the power distribution plate 40 and the susceptor 12. Referring to FIG. 1, the high frequency power feed path 36, especially the main power feeder 38, is electromagnetically shielded between the matching unit 34 and the bottom surface of the chamber 10 by a cylindrical conductor 80 having an axis coaxial with that of the main power feeder 38.

Figure 2:
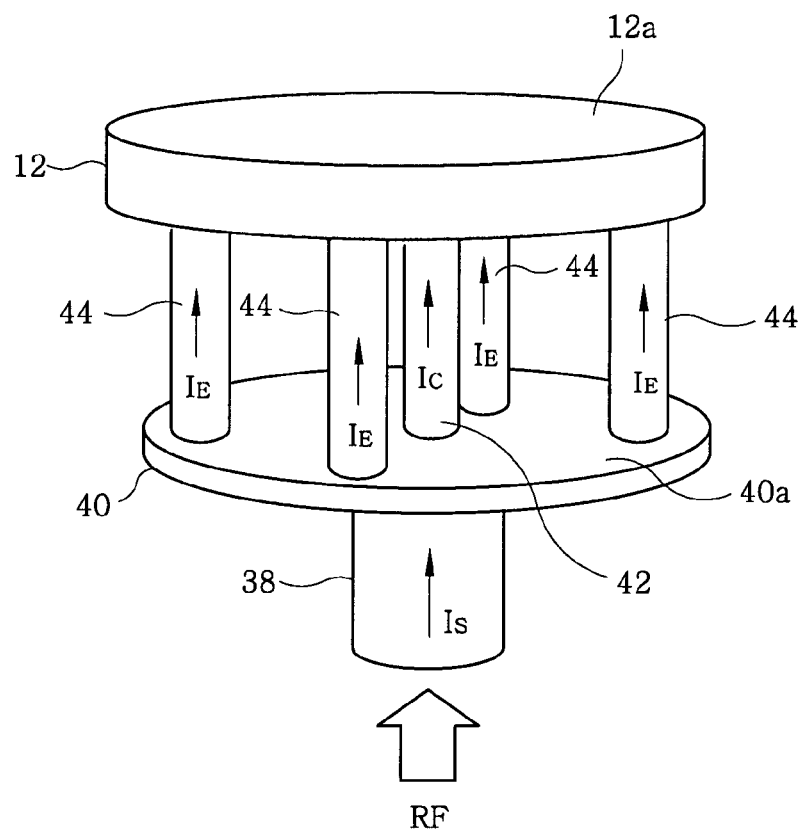
FIG. 2 illustrates a perspective view of a configuration of a high frequency power feed path in the first embodiment.
Figure 3:
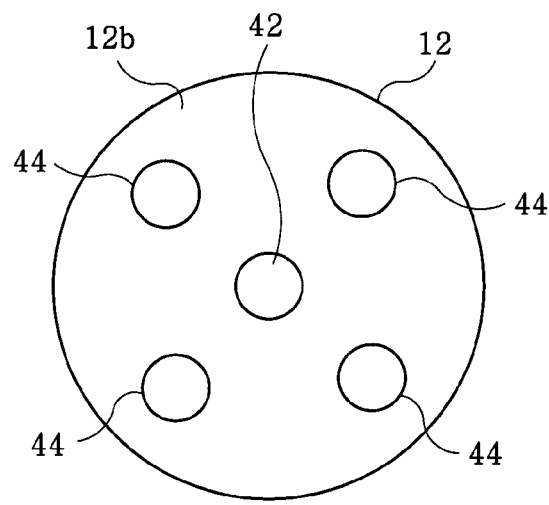
FIG. 3 provides a top view of an arrangement structure of peripheral power feeders in the high frequency power feed path of the first embodiment.

As illustrated in FIGS. 2 and 3, the central power feeder 42 is connected with a central portion of a rear surface of the susceptor 12 and, also, the peripheral power feeders 44 are connected with a peripheral portion of the rear surface of the susceptor 12, the peripheral power feeders 44 being spaced from each other at specific intervals (90° C. in this example) in a circumferential direction. Each of the components 38 to 44 forming the high frequency power feed path 36 may be made of aluminum or copper coated with silver. Further, each of the power feeders 38, 42 and 44 may be formed in a columnar or a cylindrical shape (a hollow tube shape). Moreover, it is preferable that each of the (four) peripheral power feeders 44 has same waveguide characteristics and same material, shape and size for symmetrical distribution of power and current in the susceptor 12. Furthermore, positions of connection points of the peripheral power feeders 44 to the susceptor 12 (especially, positions of a radial direction) can be determined depending on a diameter of the semiconductor wafer W mounted on the susceptor 12. For example, the peripheral power feeders 44 may be positioned directly under the edge of the semiconductor wafer W.

In the high frequency power feed path 36 configured as described above, when the high frequency power from the high frequency power supply 32 reaches the power supply plate 40 via the matching unit 34 and the main power feeder 38, it is distributed into the central power feeder 42 and the peripheral power feeders 44 and flows toward the susceptor 12 in parallel with each other. To be specific, in the power supply plate 40, the high frequency power flown from a leading end (top portion) of the main power feeder 38 flows from a backside 40b toward a front side 40a via an edge portion along the surface by skin effects. Thereafter, the high frequency power is distributed into each of the peripheral power feeders 44 and the central power feeder 22 on the front surface 40a. At this time, substantially same peripheral branch currents $I_E$ flow in the peripheral power feeders 44 due to the aforementioned symmetry and waveguide characteristics. Accordingly, a current obtained by subtracting the peripheral branch currents ($4 \times I_E$) flowing in the (four) peripheral power feeders 44 from a current $I_S$ flown from the main power feeder 38 while considering a phase difference therebetween flows as a central branch current $I_C$ ($I_S - 4 \times I_E$) in the central power feeder 42. A ratio between the central branch current $I_C$ and the peripheral branch currents $I_E$ can be set to a desired value depending on the material, shape and size of the central power feeder 42 and the peripheral power feeders 44, the number of peripheral power feeders 44 and the like.

In the susceptor 12 as well, the high frequency power flown from leading ends (top portions) of the power feeders 42 and 44 flows from the backside 12b toward the front side 12a via the edge portion along the surface by skin effects. On the main surface 12a of the susceptor, a part of the high frequency current flows as a discharge current ia toward the plasma, whereas a residual current ib flows on the surface of the electrode. The distribution of the high frequency current of the discharge current in each portion on the main surface 12a of the susceptor is a superposition of the current distribution obtained by the high frequency current $I_C$ from the central power feeder 42 and that obtained by the high frequency currents $I_E$ from each of the peripheral power feeders 44.

Figure 4:
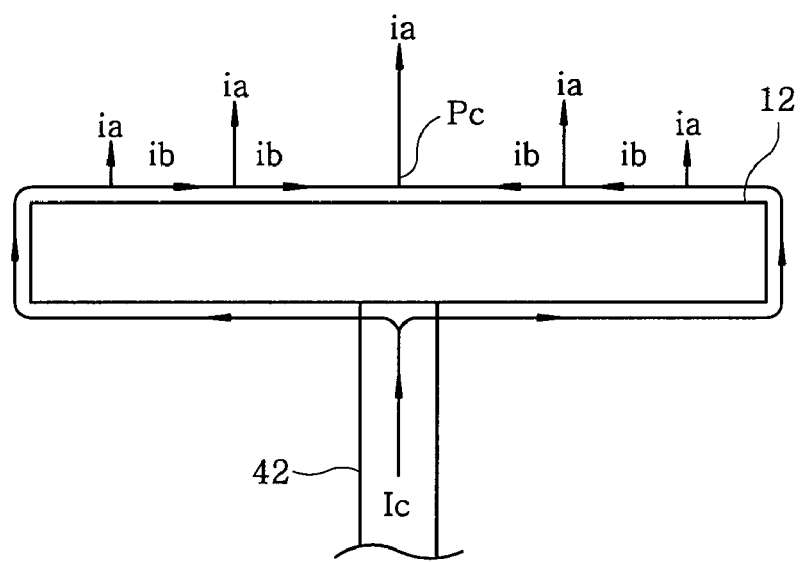
FIG. 4 schematically describes a discharge current distribution on a susceptor (lower electrode) which is obtained by a high frequency from a central power feeder in the first embodiment.
Figure 5:
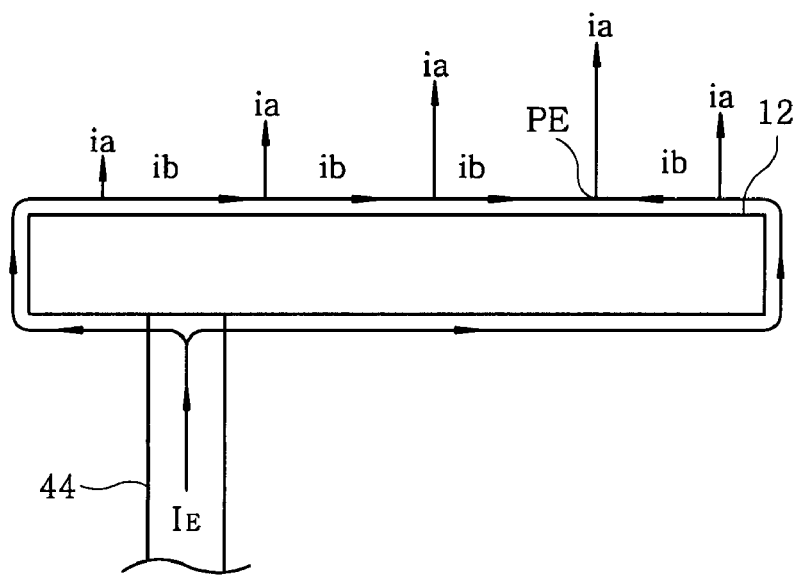
FIG. 5 schematically depicts a discharge current distribution on a susceptor (lower electrode) which is obtained by a high frequency power from the peripheral power feeders in the first embodiment.

Referring to FIG. 4 showing the current distribution on the main surface 12a of the susceptor which is obtained by the high frequency current $I_C$ from the central power feeder 42, the discharge current ia is maximum at a singularity PC provided at a position for joining the high frequency currents branched from the central power feeder 42 to both sides in a diametric direction of the susceptor, i.e., at the central portion of the susceptor which is provided at an opposite side of the central power feeder 42. Meanwhile, referring to FIG. 5 depicting the current distribution on the main surface 12a of the susceptor which is obtained by the high frequency current $I_E$ from the peripheral power feeder 44, the discharge current ia is maximum at a singularity PE provided at a position for joining the high frequency currents branched from the peripheral power feeder 42 to both sides in the diametric direction of the susceptor, i.e., at a position provided at an opposite side of the peripheral power feeder 44 (point symmetry).

When the current distribution obtained by the high frequency current $I_C$ supplied from the central power feeder 42 and that obtained by high frequency current $I_E$ supplied from the four peripheral power feeders 44 are superposed, the resultant discharge current in each portion on the main surface 12a of the susceptor becomes uniform in either a radial direction or a circumferential direction. Accordingly, uniformity in the density spatial distribution characteristics of the plasma generated above the susceptor 12 is improved, and, further, in-surface uniformity of the process characteristics (an etching rate, a CD or the like) on the semiconductor wafer W is improved.

Embodiment 2

Figure 6:
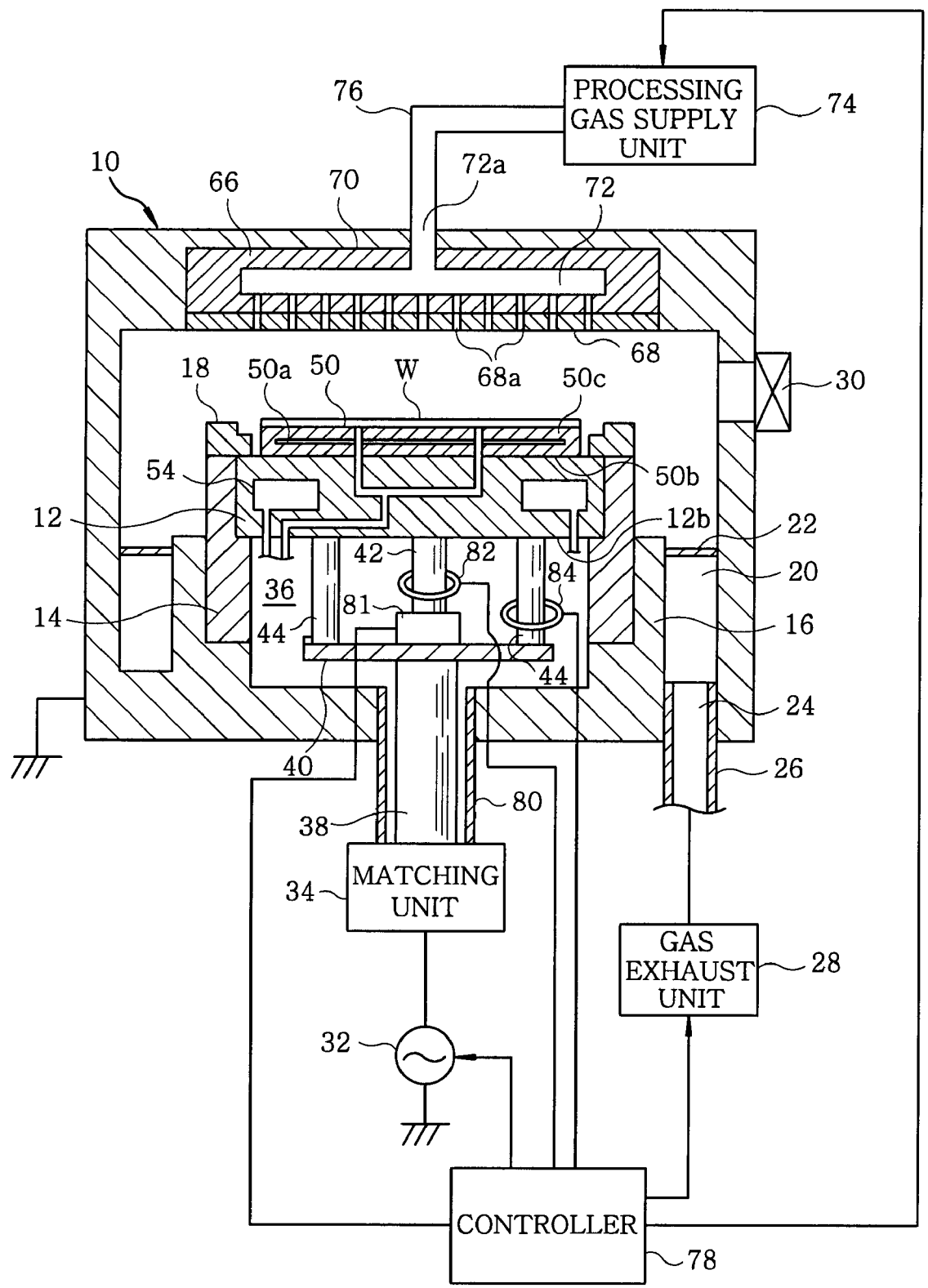
FIG. 6 offers a vertical cross sectional view of a configuration of principal parts (high frequency power feed path) of a plasma processing apparatus in accordance with a second embodiment of the present invention.

FIG. 6 shows a configuration of principal parts (high frequency power feed path) of a plasma processing apparatus in accordance with a second embodiment of the present invention. The plasma processing apparatus of the second embodiment is the same as the apparatus of the first embodiment except that a variable capacitor unit 81 and current measuring units 82 and 84 are attached to the high frequency power feed path 36. Therefore, like reference numerals will be given to like parts having substantially same configurations or functions.

As shown in FIG. 6, the variable capacitor unit 81 is provided between the power distribution plate 40 and the central power feeder 42 in the high frequency power feed path 36. The variable capacitor unit 81 includes therein a variable capacitor (for example, a vacuum variable capacitor), which is an actual electrically connected component between the power supply plate 40 and the central power feeder 42, and an actuator (e.g., a motor), which varies a capacitance of the variable capacitor under the control of the controller 78. By connecting the variable capacitor unit 81 and the central power feeder 42 in series, a combined impedance of the serial circuit becomes greater than that obtained in case the variable capacitor unit 81 is not inserted. Accordingly, the combined impedance can be varied by varying a capacitance of the variable capacitor unit 81. In other words, the combined impedance can be increased by decreasing a capacitance of the variable capacitor unit 81. As a consequence, the central branch current $I_C$ flowing in the central power feeder 42 can be relatively reduced and, hence, the peripheral branch currents $I_E$ flowing in the peripheral power feeders 44 can be relatively increased.

The current measuring units 82 and 84 have a current transformer or an antenna coil and detect current values of the central branch current $I_C$ flowing in the central power feeder 42 and the peripheral branch currents $I_E$ flowing in the peripheral power feeders 44, respectively. In general, each of the peripheral power feeders 44 is supplied with the same peripheral branch current $I_E$, so that the current measuring unit 84 may be attached to any one of the peripheral power feeders 44. Signals outputted from the current measuring units 82 and 84 (detected values of the branch currents) are transmitted to the controller 78.

As described above, the controller 78 can vary a ratio (distribution ratio) between the central branch current $I_C$ flowing in the central power feeder 42 and the peripheral branch currents $I_E$ flowing in the peripheral power feeders 44 by varying a capacitance of the variable capacitor unit 81. Further, the controller 78 can control the distribution ratio to a desired value through the feedback on the current values of the central branch current $I_C$ and the peripheral branch currents $I_E$ detected by the current measuring units 82 and 84. By variably controlling the distribution ratio, it is possible to precisely uniform the discharge current distribution on the main surface 12a of the susceptor 12. Further, it is possible to achieve a desired inclination in the discharge current distribution characteristics on the susceptor 12 (by increasing the inclination in the edge portion than in the central portion) and also possible to correct a deflection or a deviation in an etching rate distribution due to external factors (e.g., gas flow rate).

Embodiment 3

Figure 7:
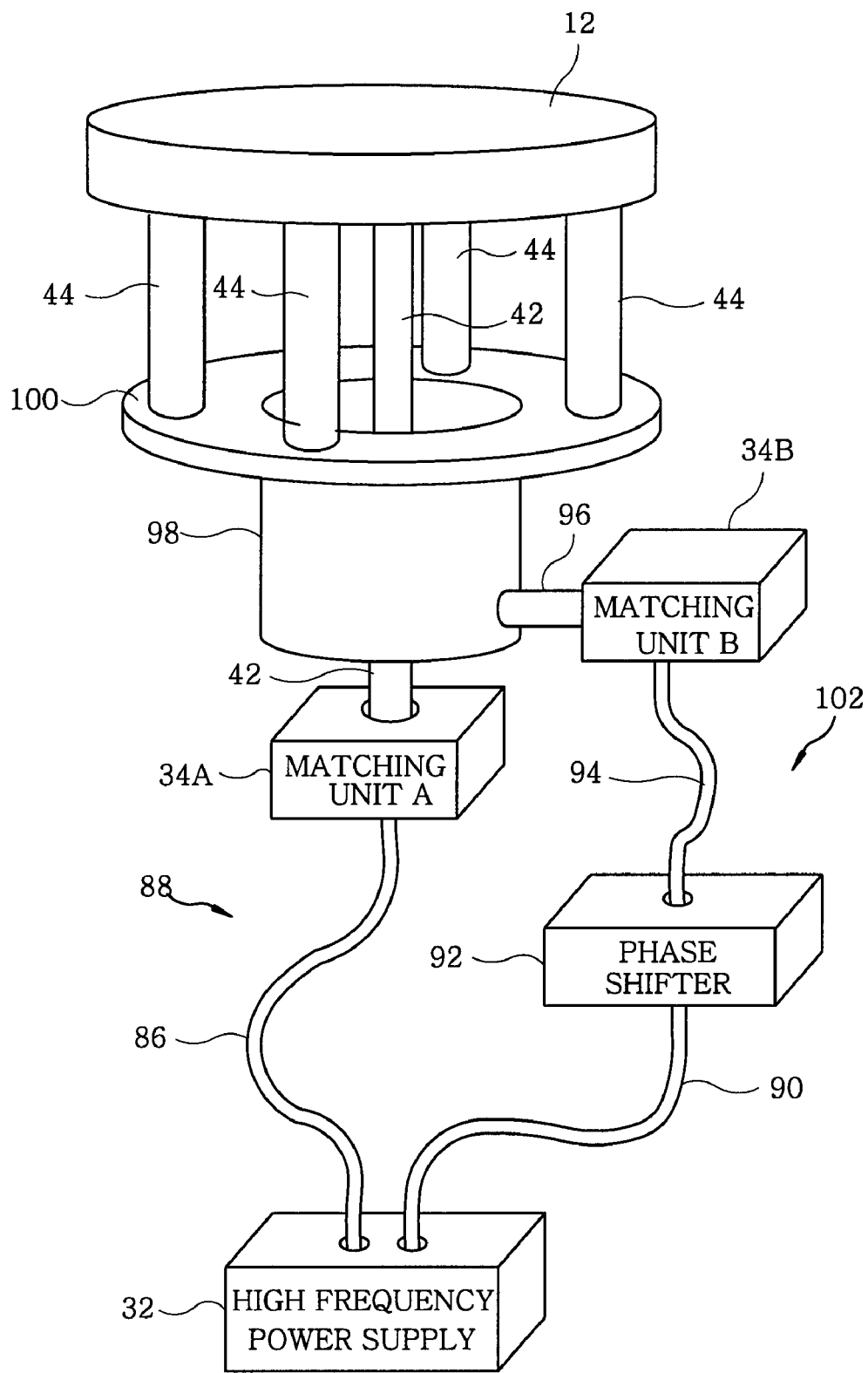
FIG. 7 presents a perspective view of a configuration of principal parts (high frequency power supply systems) of a plasma etching apparatus in accordance with a third embodiment of the present invention.

FIG. 7 illustrates a configuration of principal parts of a plasma etching apparatus in accordance with a third embodiment of the present invention. The third embodiment is equal to the first embodiment except that it has different high frequency power supply systems.

As described in FIG. 7, in this embodiment, the central power feeder 42 and the peripheral power feeders 44 have different systems in the high frequency power feed path from the high frequency power supply 32 to the susceptor 12. To be specific, a first power feed system 88 includes an output terminal of the high frequency power supply 32, a cable 86, a matching unit 34A, the central power feeder 42 and the susceptor 12. Meanwhile, a second power feed system 102 includes another output terminal of the high frequency power supply 32, a cable 90, a phase shifter 92, a cable 94, a matching unit 34B, a power feeder 96, a power feeder 98, an annular power supply plate 100, the peripheral power feeders 44 and the susceptor 12.

The first power feed system 88 corresponds to a conventional power feed path. In the first power feed system 88, the high frequency power outputted from the high frequency power supply 32 is supplied to the central power feeder 42 via the cable 86 and the first matching unit A 34. Next, the high frequency power flows toward the main surface 12a of the susceptor 12 as in the first embodiment and then is discharged into a plasma space.

The second power feed system 102 is added in the present embodiment. In the second power feed system 102, the high frequency power outputted from the high frequency power supply 32 reaches the power feeder 98 via the cable 90, the phase shifter 92, the cable 94, the second matching unit B 34 and the power feeder 96. Next, the high frequency power is distributed from the annular power supply plate 100 to the plural (four in this example) peripheral power feeders 44. Thereafter, the high frequency power flows toward the main surface 12a of the susceptor 12 as in the first embodiment and then is discharged into the plasma space. It is preferable that the power feeder 98 and the annular power supply plate 100 are formed as a unit.

The phase shifter 92 is formed of an RC circuit having a volume resistance or a variable capacitor and can change a phase of the high frequency power passing through the second power feed system 102 within the range of about 0° C. to about 180° C., for example, under the control of the controller 78 (see FIG. 1). By shifting the phase of the high frequency power passing through the second power feed system 102, a phase difference is generated between the central branch current $I_C$ flowing in the central power feeder 42 and the peripheral branch currents $I_E$ flowing in the peripheral power feeders 44. A superposition state (the amount of resultant vector) of both high frequency currents $I_C$ and $I_E$ in each portion on the main surface 12a of the susceptor 12 can be controlled depending on the phase difference. By controlling the phase, it is possible to uniform the discharge current distribution characteristics on the main surface 12a of the susceptor 12 or accomplish a desired deviation or deflection in the discharge current distribution characteristics. In addition, the phase shifter 92 may be provided at the first power feed system 88.

While the invention has been shown and described with respect to the embodiments, it will be understood by those skilled in the art that various changes and modification may be made without departing from the scope of the invention.

For example, although the peripheral power feeder has a plurality of peripheral power feeders 44 in the aforementioned embodiments, the peripheral power feeder of the present invention may be a single cylindrical power feeder such as the power feeder 98 of the third embodiment. Further, although the main power feeder 38 is branched into the central power feeder 42 and the peripheral power feeders 44 via the power distribution plate 40 in the first and the second embodiment, the main power feeder 38 can be directly branched into the central power feeder 42 and the peripheral power feeders 44. Moreover, the variable capacitor unit 81 may be provided at the peripheral power feeder in the second embodiment of the present invention.

Although it is not illustrated, there may be employed a type that two radio frequency powers, a relatively high frequency (e.g., 40 MHz) power and a relatively low frequency (e.g., 2 MHz) power, are applied to the susceptor 12. Alternatively, in case a high frequency power for plasma generation is applied to an upper electrode, the present embodiment may be applied to an upper power feed path supplying the high frequency power to the upper electrode. In other words, the present invention can be applied to a plasma processing apparatus having at least one electrode in an evacuable processing chamber. Besides, the present invention can be applied to other plasma processing such as plasma CVD, plasma oxidation, plasma nitrification, sputtering and the like other than plasma etching. Further, as for a target substrate, the present invention may use various substrates for plat panel display, a photomask, a CD substrate, a printed circuit board or the like other than a semiconductor wafer.

While the invention has been shown and described with respect to the embodiments, it will be understood by those skilled in the art that various changes and modification may be made without departing from the scope of the invention as defined in the following claims.

What is claimed is:

1. A plasma processing apparatus for performing a desired plasma processing on a target substrate by using a plasma generated from a processing gas by forming a high frequency electric field in an evacuable processing chamber, the plasma processing apparatus comprising:
    a high frequency power supply for outputting a high frequency power;
    a plate-shaped electrode disposed in the evacuable processing chamber;
    a central power feeder connected with a central portion of a rear surface of the electrode to supply the high frequency power from the high frequency power supply to the electrode; and
    a peripheral power feeder member connected with a peripheral portion of the rear surface of the electrode in parallel with the central power feeder to supply the high frequency power from the high frequency power supply to the electrode,
    wherein the central portion of the rear surface of the electrode and the peripheral portion of the rear surface of the electrode are electrically connected and conductive to each other.

2. The plasma processing apparatus of claim 1, wherein the peripheral power feeder member has a plurality of peripheral power feeders connected with the peripheral portion of the rear surface of the electrode, the peripheral power feeders being spaced from each other at regular intervals in a circumferential direction.

3. The plasma processing apparatus of claim 2, wherein the plural peripheral power feeders are provided between the rear surface of the electrode and a conductive power distribution plate placed under the electrode to face same, the conductive power distribution plate being electrically connected with the high frequency power supply.

4. The plasma processing apparatus of claim 3, wherein the central power feeder is provided between the rear surface of the electrode and the power distribution plate.

5. The plasma processing apparatus of claim 1, further comprising a variable capacitor connected in series with at least one of the central power feeder and the peripheral power feeder member to apply a variable impedance.

6. The plasma processing apparatus of claim 5, further comprising a first current measuring unit for measuring a current value of a central branch current flowing in the central power feeder; a second current measuring unit for measuring a current value of a peripheral branch current flowing in the peripheral power feeder member; and a capacitance controller for controlling a capacitance of the variable capacitor based on the current values of the central and the peripheral branch current measured by the first and the second current measuring unit, respectively.

7. The plasma processing apparatus of claim 1, further comprising a phase shifter for shifting a phase of the high frequency power passing through either the central power feeder or the peripheral power feeder member.

8. The plasma processing apparatus of claim 1, further comprising a facing electrode facing the electrode in parallel in the processing chamber.

9. The plasma processing apparatus of claim 1, wherein the target substrate is supported on the electrode.

10. The plasma processing apparatus of claim 9, further comprising an additional high frequency power supply for supplying an additional high frequency power having a frequency lower than that of the high frequency power outputted to the electrode, wherein the additional high frequency power is also supplied to the electrode.

11. The plasma processing apparatus of claim 8, wherein the target substrate is supported on the facing electrode.

12. The plasma processing apparatus of claim 1, wherein the high frequency power flowing from leading ends of the central power feeder and the peripheral power feeder member flows from a backside of the electrode toward a front side of the electrode via an edge portion of the electrode along a surface of the electrode, wherein the front side of the electrode faces the plasma.

13. The plasma processing apparatus of claim 1, wherein at least an entirety of a surface region of the electrode is electrically conductive.

14. The plasma processing apparatus of claim 1, wherein the electrode is made of a single conductive material.

* * * * *